United States Patent [19]

Heinke

[11] Patent Number: 5,880,827
[45] Date of Patent: Mar. 9, 1999

[54] MEASUREMENT SYSTEM WITH LARGE DYNAMIC RANGE

[75] Inventor: Thomas Heinke, Santa Cruz, Calif.

[73] Assignee: Raytek Subsidiary, Inc.,, Santa Cruz, Calif.

[21] Appl. No.: 967,414

[22] Filed: Nov. 11, 1997

[51] Int. Cl.⁶ .................. G01J 1/46; G05F 1/613
[52] U.S. Cl. .......... 356/224; 356/226; 356/218; 307/311; 323/226
[58] Field of Search ............ 356/213, 214–229; 250/214 R, 214 B, 214 A; 307/311, 491, 359, 228, 317; 323/226, 223

[56] References Cited

U.S. PATENT DOCUMENTS

| | | | |
|---|---|---|---|
| 3,558,917 | 1/1971 | Crouse | 307/235 |
| 4,666,301 | 5/1987 | Gruenke | 356/224 |
| 5,260,644 | 11/1993 | Curtis | 323/226 |

*Primary Examiner*—Hoa Q. Pham
*Attorney, Agent, or Firm*—Townsend and Townsend and Crew LLP

[57] ABSTRACT

A measurement circuit having high dynamic range includes high-gain and low-gain amplifiers connected in parallel. A shunt feedback circuit is activated to prevent the high-gain amplifier from saturating when the magnitude of an input signal exceeds its dynamic range. The output of the high-gain amplifier is utilized to measure small input signals and the output of the low-gain amplifier is utilized to measure large input signals.

4 Claims, 2 Drawing Sheets

MEASUREMENT SYSTEM WITH LARGE DYNAMIC RANGE

BACKGROUND OF THE INVENTION

1. Field of the Invention

The present invention relates generally to measurement systems and more particularly to a measurement system having a large dynamic range.

2. Description of the Relevant Art

One of the objectives in the design of electronic equipment is to provide a large dynamic range. The dynamic range of electronic equipment may be defined in terms of the largest and smallest level of the input signal that can be processed by the equipment. For the purpose of this disclosure the definition of the dynamic range is the ratio of the difference between the magnitude of the largest signal minus the magnitude of the smallest signal divided by the magnitude of the smallest signal.

In the design of infrared radiometers, a large dynamic range means that one instrument can be used to measure a large range in target temperatures. A large dynamic range is useful in reducing the cost of producing an instrument as well as the cost to customers whose processes require a large range. In infrared thermometry the dynamic range required of an instrument can be very large because the electrical signal produced by an infrared detector increases exponentially as the temperature of the target is increased. It may require several models to cover a given range of target temperatures.

At present there are several ways to increase the dynamic range of electronic equipment. These include the use of a logarithmic amplifier, integrating amplifier, or changing in real time the gain of an amplifier.

However, each of the above-described ways have disadvantages of having a slow response time or requiring a multitude of electronic components for realization.

SUMMARY OF THE INVENTION

According to one aspect of the invention, a measurement circuit rapidly changes the gain of an amplifier and minimizes the number of electronic components required.

According to another aspect of the invention, a pair of operational amplifiers are coupled in parallel to amplify the measurement signal output by a detector. One of the amplifiers is a high-gain amplifier and one of the amplifiers is a low-gain amplifier. A shunt feedback circuit prevents the high-gain amplifier from saturating for large input signals.

According to another aspect of the invention, a plurality of amplifiers, having different gains, have their inputs coupled in parallel to a detector. High gain amplifiers include shunt feedback circuits to prevent saturation when the magnitude of the measurement signal increases.

According to another aspect of the invention, the detector is an infrared detector which generates a measurement signal indicating the intensity of incident radiation.

According to another aspect of the invention, the shunt feedback circuit includes a comparator and a shunt circuit for shunting a feedback resistor when the input signal is large.

Other features and advantages of the invention will be apparent in view of the following detailed description and appended drawings.

DETAILED DESCRIPTION OF THE PREFERRED EMBODIMENTS

Figure 1:
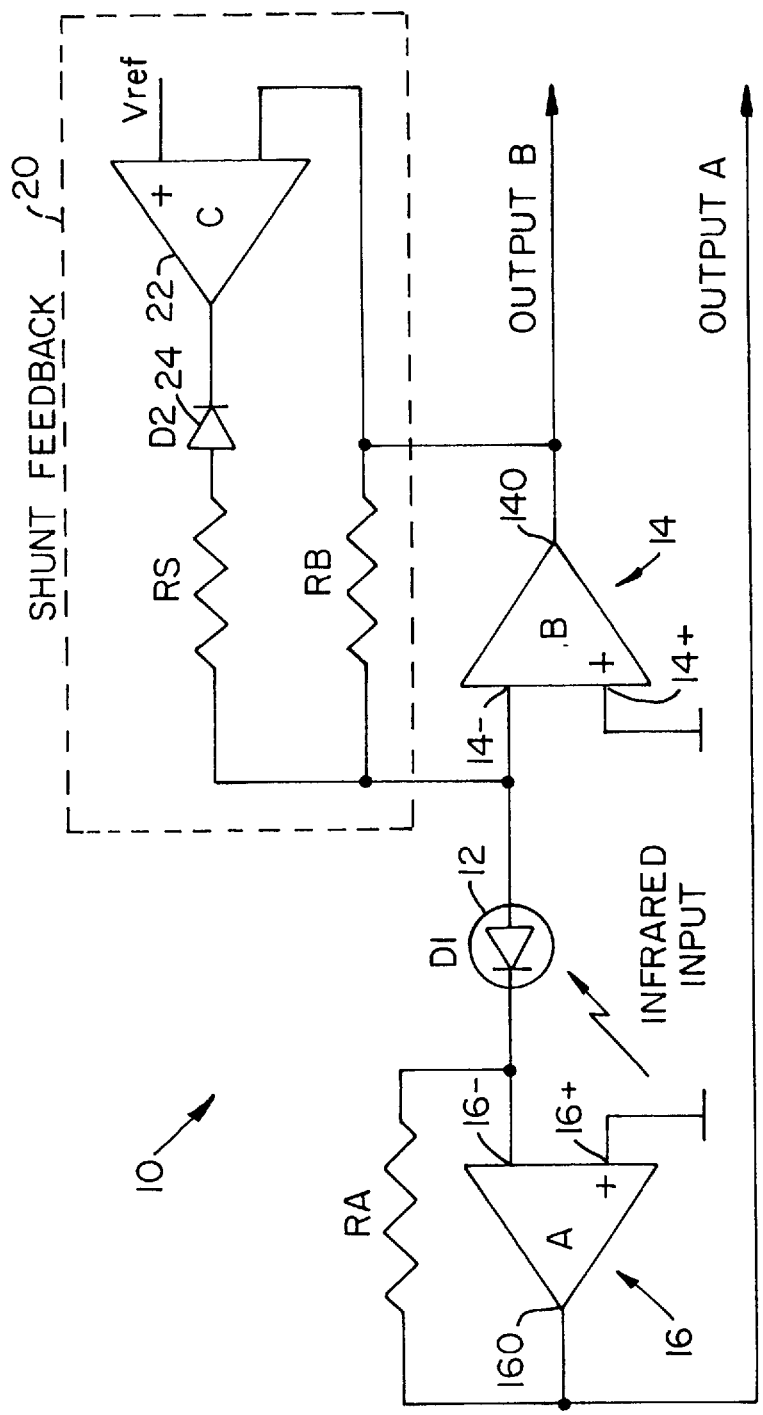
FIG. 1 is a circuit diagram of a preferred embodiment of the invention.

A preferred embodiment of the invention is depicted in FIG. 1. A measurement system 10 includes a detector 12, a high-gain amplifier circuit 14, and low-gain amplifier circuit 16. The high-gain amplifier circuit 14 includes an inverting input 14−, a non-inverting input 14+, an output terminal 14o and a high-gain feedback resistor RB. Similarly, the low-gain amplifier circuit 16 includes an inverting input 16−, a non-inverting input 16+, an output terminal 16o, and a low-gain feedback resistor RA.

The output terminal 14o of the high-gain amplifier 14 is coupled to a HIGH GAIN OUTPUT (Output B) of the measuring circuit 10 and the output terminal 16o of the low-gain amplifier 16 is coupled to the LOW GAIN OUTPUT (Output A) of the measuring circuit 10.

The detector 12 has first and second terminals, with the first terminal coupled the inverting input 14− of the high-gain amplifier 14 and the second terminal coupled to the inverting input 16− of the low gain amplifier 16.

A shunt feedback circuit 20 couples the inverting input 14− to the output 14o of the high-gain amplifier 14. The shunt feedback circuit 20 includes a comparator 22 having a first input coupled to the output 14o of the high-gain amplifier 14 and a second input coupled to receive a reference voltage. A shunt circuit, including a shunt resistor Rs and a shunt diode 24, couples the inverting input 14− of the high-gain amplifier 14 to the output of the comparator 22.

The operation of the embodiment depicted in FIG. 1 will now be described. The high-gain and low-gain amplifiers 14 and 16 are connected in parallel. The outputs of both amplifiers 14 and 16 are monitored. If the signal into the high-gain amplifier does not exceed its dynamic range, then the output of the high-gain amplifier is utilized as the output of the measuring circuit 10. If the signal into the high-gain amplifier 14 approaches its dynamic range, then the output from the low-gain amplifier is utilized as the output of the measuring circuit 10. The utility of the shunt feedback circuit 20 in FIG. 1 is that it facilitates connecting two amplifiers 14 and 16 in parallel.

The measurement system 10 described is advantageously utilized in a radiometer which measures the temperature of a target object based on the intensity of infrared (IR) radiation emitted by the target. In this utilization, detector 12 is an IR detector which generates a measurement signal indicating the intensity of the IR radiation incident on the detector 12.

The difficulty with connecting two operational amplifiers in parallel is that as one goes into saturation, its input is no longer kept at virtual ground, which prevents the other amplifier from operating properly. The shunt feedback circuit 20 functions to prevent this from happening, whereby the amplifiers are connected in parallel but act independently.

Preventing the saturation of one amplifier from affecting the other is accomplished as shown in the circuit of FIG. 1 by shunting the feedback resistor RB of the high-gain amplifier 14 to keep the high-gain amplifier 14 from saturating. Before the high-gain amplifier 14 goes into saturation, the comparator 22 senses the onset of saturation and connects the shunt resistor Rs to reduce the gain of the high-gain amplifier 14. The shunt diode 24 is connect in series with the shunt resistor Rs to eliminate any current flowing when the shunt path is turned off.

Figure 2:
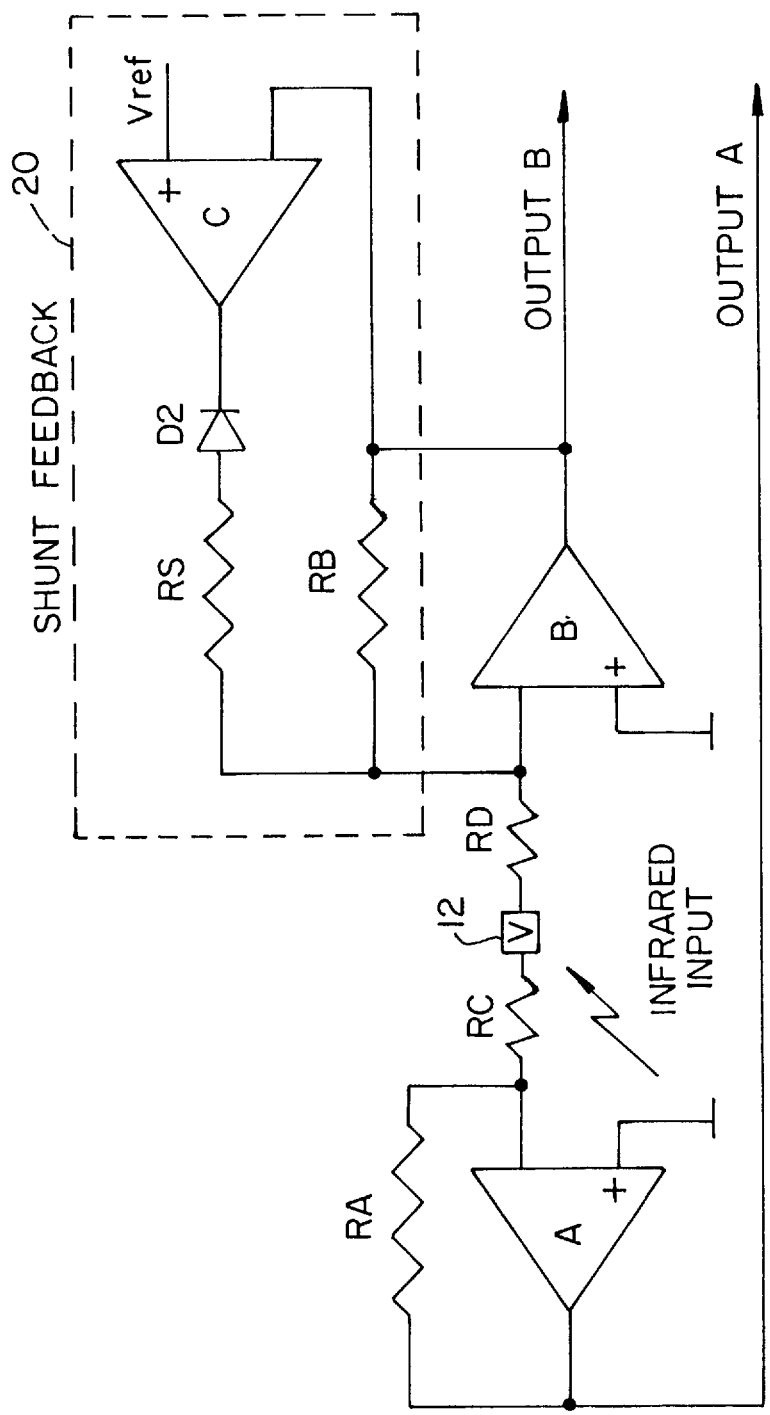
FIG. 2 is a circuit diagram of an alternate embodiment of the invention.

In the embodiment depicted in FIG. 2, the detector 12 is a photodiode that emits a measurement signal is the form of a current that indicates the magnitude of the incident IR emitted by a target. In FIG. 1, the amplifiers 14 and 16 are transimpedance amplifiers. The first amplifier 16 has a conventional feedback resistor RA to achieve a transimpedance gain of RA. The second amplifier 14 has a shunt feedback configuration comprising a feedback resistor RB connected in parallel with a series combination of a shunt resistor RS, diode 24 and comparator 22.

If the output of the second amplifier 16 is within its dynamic range, then the comparator 22 is off and the transimpedance gain of the second amplifier 16 is RB. The reference voltage of the comparator is set such that when the output voltage of the second amplifier 16 approaches the point at which saturation occurs then the comparator switches on and prevents any further increase in the input signal from causing the second amplifier 16 to go into saturation. If the second amplifier 16 were allowed to saturate then the input to the first amplifier 14 would be perturbed such that it would not produce the same signal as if the second amplifier 16 were not in saturation.

FIG. 2 depicts an alternative embodiment where the detector 12 generates a voltage measurement signal indicating the magnitude of the quantity being measured. The gain of each amplifier is the ratio of the input resistance to the feedback resistance. The shunt feedback circuit 20 functions as described above.

The invention has now been described with reference to the preferred embodiments, alternatives and substitutions will now be apparent to persons of skill in the art. In particular, different circuits for shunting the high-gain resistor, such as a diode clamp, might be utilized by persons of skill in the art. Additionally, a plurality of amplifiers, having different gains, could have their inputs coupled in parallel to the detector. The high-gain amplifiers would include shunt feedback circuits to prevent saturation when the magnitude of the measurement signal increases. Accordingly, it is not intended to limit the invention except as provided by the appended claims.

What is claimed is:

1. A measurement system that receives an input signal and provides an output signal indicating the magnitude of the input signal, with the amplifier circuit having a large dynamic range, said measurement system comprising:

a high-gain amplifier circuit, including an operational amplifier having inverting and non-inverting input terminals and an output terminal, with a high-gain feedback resistor coupling the output terminal to the inverting input terminal;

a low-gain amplifier circuit, including an operational amplifier having inverting and non-inverting input terminals and an output terminal, with a low-gain feedback resistor coupling the output terminal to the inverting input terminal;

a detector, having first and second terminals, for generating a measurement signal having a magnitude indicating the magnitude of a quantity to be measured, with the fist terminal of said detector coupled to the inverting input of said high-gain amplifier and the second terminal coupled to the inverting input of said low-gain amplifier; and a shunt feedback circuit, coupled to the inverting and output terminals of said high-gain amplifier circuit and coupled to receive a reference voltage signal of a predetermined magnitude, said shunt feedback circuit for shunting current from the high-gain feedback resistor when an output voltage magnitude at the output terminal of the high-gain amplifier circuit is greater than said predetermined magnitude to reduce the gain of the high-gain amplifier circuit and prevent is from saturating for large input signals.

2. The system of claim 1 wherein said shunt feedback circuit comprises:

a comparator having a first input terminal coupled to the output terminal of said high-gain amplifier circuit, a second input terminal coupled to receive said reference voltage signal, and an output terminal; and a shunt circuit, including a shunt diode, coupling the inverting terminal of said high-gain amplifier circuit to the output terminal of said comparator, with said comparator forward biasing said shunt diode when said output voltage magnitude is greater than said predetermined magnitude.

3. The system of claim 1 wherein said detector is an IR detector that outputs a measurement signal indicating the intensity of IR radiation incident on the detector.

4. A measurement system comprising:

a detector for generating a measurement signal having a signal amplitude;

a plurality of amplifiers, each having a dynamic range and having parallel inputs coupled to receive said measurement signal;

a shunt feedback circuit coupled to at least one amplifier to shunt current from said at least one amplifier when the signal amplitude exceeds the dynamic range of said at least one amplifier to prevents said at least one amplifier from saturating to assure an other amplifier in said plurality remains functional when said signal amplitude exceeds said dynamic range of said at least one amplifier.

* * * * *